United States Patent

Lin et al.

(10) Patent No.: US 9,627,047 B2
(45) Date of Patent: Apr. 18, 2017

(54) METHOD FOR INCREASING SPEED OF WRITING DATA INTO FLASH MEMORY UNIT AND ASSOCIATED DEVICE

(71) Applicant: Silicon Motion Inc., Hsinchu County (TW)

(72) Inventors: Ching-Hui Lin, Taipei (TW); Tsung-Chieh Yang, Hsinchu (TW)

(73) Assignee: Silicon Motion Inc., Hsinchu County (TW)

( * ) Notice: Subject to any disclaimer, the term of this patent is extended or adjusted under 35 U.S.C. 154(b) by 0 days.

(21) Appl. No.: 14/972,103

(22) Filed: Dec. 17, 2015

(65) Prior Publication Data

US 2016/0180927 A1    Jun. 23, 2016

(30) Foreign Application Priority Data

Dec. 17, 2014  (TW) .............................. 103144137 A

(51) Int. Cl.
*G11C 16/04* (2006.01)
*G11C 11/56* (2006.01)
*G11C 16/10* (2006.01)

(52) U.S. Cl.
CPC .......... *G11C 11/5628* (2013.01); *G11C 16/10* (2013.01); *G11C 11/5621* (2013.01); *G11C 11/5642* (2013.01)

(58) Field of Classification Search
CPC ............ G11C 11/5628; G11C 11/5642; G11C 11/5621
USPC ............................ 365/185.03, 185.11, 185.28
IPC ........................ G11C 11/5628,11/5642, 11/5621
See application file for complete search history.

(56) References Cited

U.S. PATENT DOCUMENTS

| | | | | |
|---|---|---|---|---|
| 7,911,842 B2* | 3/2011 | Park | .................... | H01L 29/7883 |
| | | | | 365/185.03 |
| 8,031,525 B2* | 10/2011 | Park | .................... | G11C 11/5628 |
| | | | | 365/185.11 |
| 2009/0027961 A1 | 1/2009 | Park | | |
| 2011/0153919 A1 | 6/2011 | Sabbag | | |
| 2016/0148677 A1* | 5/2016 | Yang | .................... | G11C 11/5628 |
| | | | | 365/185.03 |

FOREIGN PATENT DOCUMENTS

KR    1020090011249 A    2/2009

\* cited by examiner

*Primary Examiner* — Connie Yoha
(74) *Attorney, Agent, or Firm* — Winston Hsu; Scott Margo

(57) ABSTRACT

A method for writing data into a flash memory unit includes: when writing data into the flash memory unit for the n-th time, determining a data polarity of an n-th data bit to be written into the flash memory unit; selectively injecting an n-th electrical charge amount into a floating gate of the flash memory unit according to the data polarity of the n-th data bit; when writing data into the flash memory unit for the (n+1)-th time, determining the data polarity of an (n+1)-th data bit to be written into the flash memory unit; and selectively injecting an (n+1)-th electrical charge amount into the floating gate of the flash memory unit according to the data polarity of the (n+1)-th data bit. The (n+1)-th electrical charge amount is not equal to the n-th electrical charge amount, and n is a positive integer not less than 1.

20 Claims, 6 Drawing Sheets

METHOD FOR INCREASING SPEED OF WRITING DATA INTO FLASH MEMORY UNIT AND ASSOCIATED DEVICE

BACKGROUND OF THE INVENTION

1. Field of the Invention

The present invention relates to a method and an associated control device for writing data into a flash memory, and more particularly, to a method and an associated control device for extending the service life and increasing the operation speed of a flash memory.

2. Description of the Prior Art

A flash memory control circuit has to erase data previously stored in a memory unit of a flash memory before writing new data into the memory unit. This operation may slow the data writing speed of the flash memory, because the flash memory control circuit takes a certain amount of time to erase the data. Further, the service life of a flash memory is limited by the writing times and erasing times. Increasing the writing and erasing times may shorten the service life of the flash memory; therefore, by reducing the writing times and erasing times of the flash memory, the service life of the flash memory can be extended. Hence, how to reduce the writing times and erasing times of the flash memory, so as to increase the operation speed and extend the service life of the flash memory has become an important issue to be solved in this field.

SUMMARY OF THE INVENTION

An objective of the present invention is to provide a method and a control device for extending the service life and increasing the operation speed of a flash memory.

According to a first embodiment of the present invention, a method for writing data into a flash memory unit is disclosed. The method comprises: when writing data into the flash memory unit for the n-th time, determining a data polarity of an n-th data bit to be written into the flash memory unit; selectively injecting an n-th electrical charge amount into a floating gate of the flash memory unit according to the data polarity of the n-th data bit; when writing data into the flash memory unit for the (n+1)-th time, determining the data polarity of an (n+1)-th data bit to be written into the flash memory unit; and selectively injecting an (n+1)-th electrical charge amount into the floating gate of the flash memory unit according to the data polarity of the (n+1)-th data bit. The (n+1)-th electrical charge amount is not equal to the n-th electrical charge amount, and n is a positive integer not less than 1.

According to a second embodiment of the present invention, a control device for writing data into a flash memory unit is disclosed. The control device comprises a determining circuit and a writing circuit. The determining circuit is arranged to determine a data polarity of an n-th data bit of the flash memory unit when writing data into the flash memory unit for the n-th time. The writing circuit is arranged to inject an n-th electrical charge amount to a floating gate of the flash memory unit according to the data polarity of the n-th data bit. The determining circuit is further arranged to determine the data polarity of an (n+1)-th data bit of the flash memory unit when writing data into the flash memory unit for the (n+1)-th time, the writing circuit is further arranged to selectively inject an (n+1)-th electrical charge amount to the floating gate of the flash memory unit according to the data polarity of the (n+1)-th data bit, the (n+1)-th electrical charge amount is not equal to the n-th electrical charge amount, and n is a positive integer not smaller than 1.

Through the above concepts of the present invention, the erasing times of the physical memory page may be greatly reduced when writing data into a physical memory page, thus increasing the data writing speed and service life of the physical memory page, and therefore of an entire flash memory.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should not be interpreted as a close-ended term such as "consist of". Also, the term "couple" is intended to mean either an indirect or direct electrical connection. Accordingly, if one device is coupled to another device, that connection may be through a direct electrical connection, or through an indirect electrical connection via other devices and connections.

Figure 1:
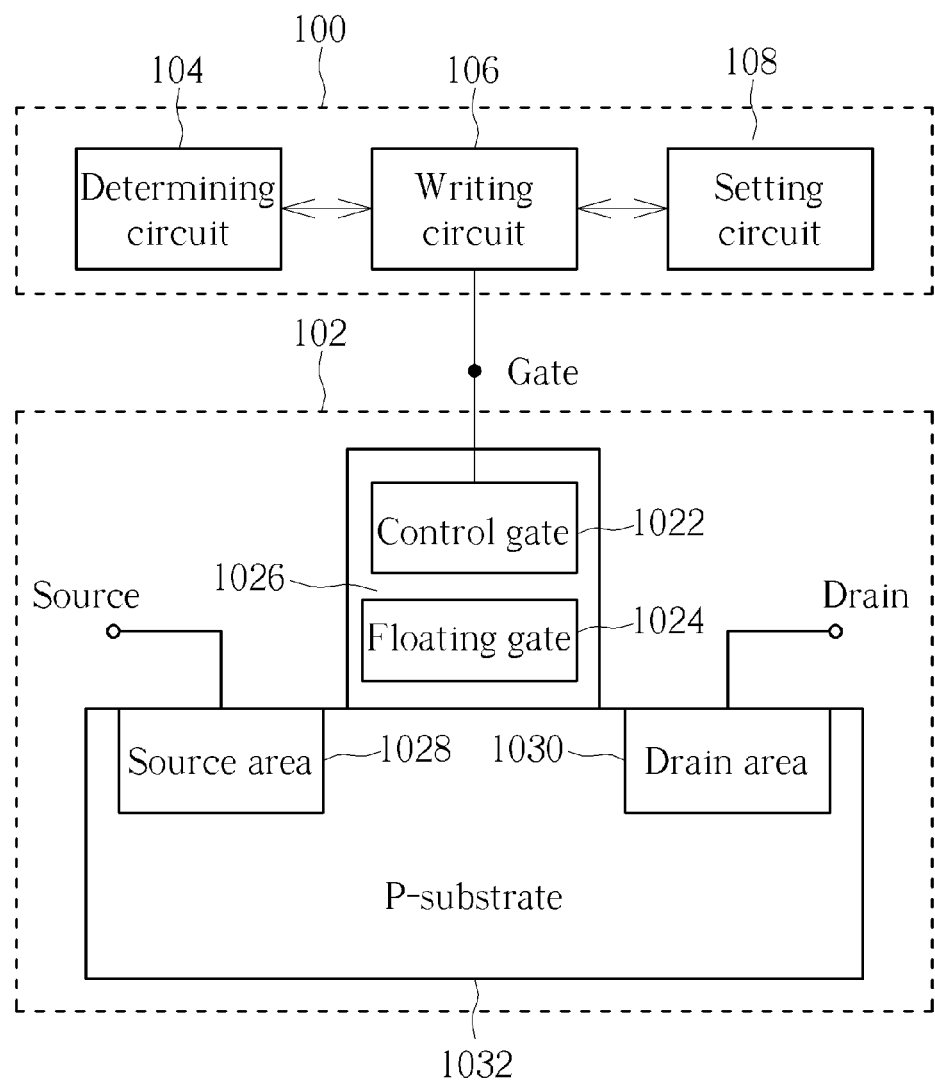
FIG. 1 is a diagram illustrating a control device according to an embodiment of the present invention.

FIG. 1 is a diagram illustrating a control device 100 according to an embodiment of the present invention. The control device 100 is a flash memory control circuit, and another flash memory unit 102 is also shown in FIG. 1. The control device 100 includes a determining circuit 104, a writing circuit 106 and a setting circuit 108. The determining circuit 104 is arranged to determine the data polarity of an n-th data bit to be written into the flash memory unit 102 when writing data into the flash memory unit 102 for the n-th time. The writing circuit 106 is arranged to selectively inject an n-th electrical charge amount into a floating gate of the flash memory unit 102 according to the data polarity of the n-th data bit. The determining circuit 104 is also arranged to selectively inject an (n+1)-th electrical charge amount to the floating gate of the flash memory unit 102 when writing data into the flash memory unit 102 for the (n+1)-th time. The writing circuit 106 is further arranged to selectively inject an (n+1)-th electrical charge amount into the floating gate of the flash memory unit 102 according to the data polarity of the (n+1)-th data bit, wherein the (n+1)-th electrical charge amount is not equal to the n-th electrical charge amount, and n is a positive integer not smaller than 1. The setting circuit 108 is arranged to determine an n-th threshold voltage corresponding to the n-th data bit.

The flash memory unit 102 may be viewed as a metal oxide semiconductor field effect transistor (MOSFET). The gate of the MOSFET includes a control gate 1022 and a floating gate 1024, wherein the control gate 1022 and the floating gate 1024 are isolated by an oxide layer 1026. For better comprehension, the flash memory unit 102 of this embodiment is implemented with an N-type FET. Hence, a source area 1028 and a drain area 1030 of the MOSFET are both N-type areas, and a P substrate 1032 is configured between the source area 1028 and the drain area 1030.

Figure 2:
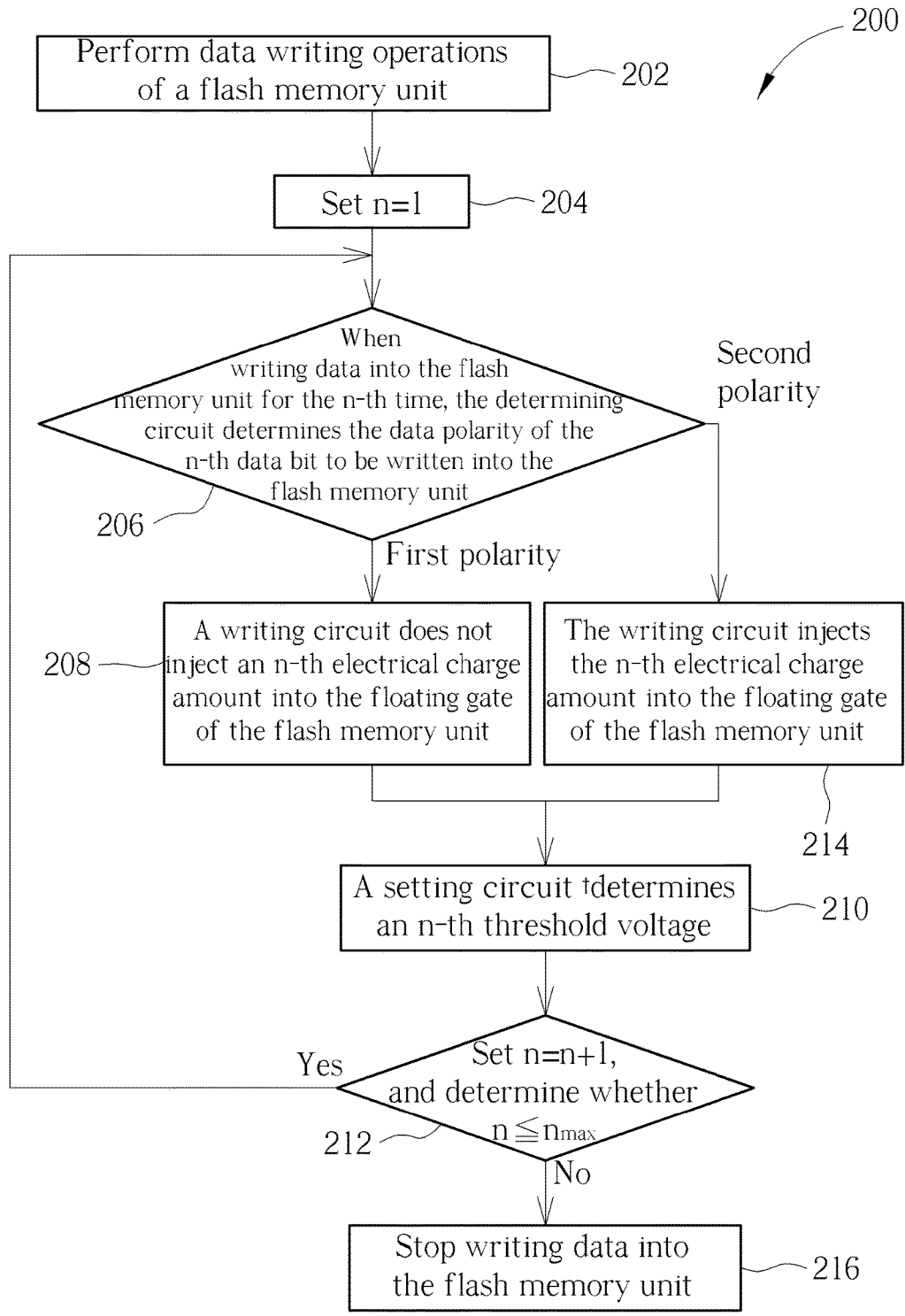
FIG. 2 is a flowchart illustrating a method for writing data into a flash memory unit according to an embodiment of the present invention.

The operations of the control device 100 may be simplified as steps shown in FIG. 2, which is a flowchart illustrating a method 200 for writing data into a flash memory unit 102 according to an embodiment of the present invention. If the result is substantially the same, the steps are not required to be executed in the exact order as shown in FIG. 2 and are not necessarily sequentially performed; that is, other steps can be inserted therein. Further, the descriptions for the technical features of this embodiment assume that the flash memory unit 102 does not store any data bit in the beginning. The method 200 can be summarized as follows:

Step 202: Perform the data writing operations of the flash memory unit 102;
Step 204: Set n=1, wherein n represents the number of times of writing data bits into the flash memory unit 102;
Step 206: When writing data into the flash memory unit 102 for the n-th time, the determining circuit 104 determines the data polarity of the n-th data bit to be written into the flash memory unit 102. If the data polarity is a first polarity (i.e. bit 1), go to Step 208; and if the data polarity is a second polarity (i.e. bit 0), go to Step 214;
Step 208: The writing circuit 106 does not inject an n-th electrical charge amount into the floating gate 1024 of the flash memory unit 102;
Step 210: The setting circuit 108 determines an n-th threshold voltage Vth_n;
Step 212: Set n=n+1, and determine whether n≤$n_{max}$. If yes, go to Step 206; otherwise, go to Step 216;
Step 214: The writing circuit 106 injects the n-th electrical charge amount into the floating gate 1024 of the flash memory unit 102. Go to Step 210;
Step 216: Stop writing data into the flash memory unit 102.

In Step 202, when the flash memory unit has not yet been written with any data bit, the floating gate 1024 of the flash memory unit 102 does not have any electrical charge. In Step 206, when writing data into the flash memory unit 102 for the first time (i.e. n=1), the determining circuit 104 determines the data polarity of the first data bit of the flash memory unit 102 which is going to be written into the flash memory unit 102. If the data polarity is determined as the first polarity (i.e. bit 1), the writing circuit 106 will not inject the first electrical charge amount into the floating gate 1024 of the flash memory unit 102 (Step 208); and if the data polarity is determined as a second polarity (i.e. bit 0), the writing circuit 106 injects the first electrical charge amount into the floating gate 1024 of the flash memory unit 102 (Step 214). Although, in this embodiment, the first polarity is bit 1 and the second polarity is bit 0, this is merely for illustrative purposes, and not meant to be a limitation to the present invention. In another embodiment of the present invention, the first polarity may be bit 0, and the second polarity may be bit 1. In this embodiment, if the data polarity is bit 1, the floating gate 1024 of the flash memory unit 102 may remain in a state with no electrical charge; if the data polarity is bit 0, the floating gate 1024 of the flash memory unit 102 will be injected with a first electrical charge amount as shown in FIG. 3.

Figure 3:
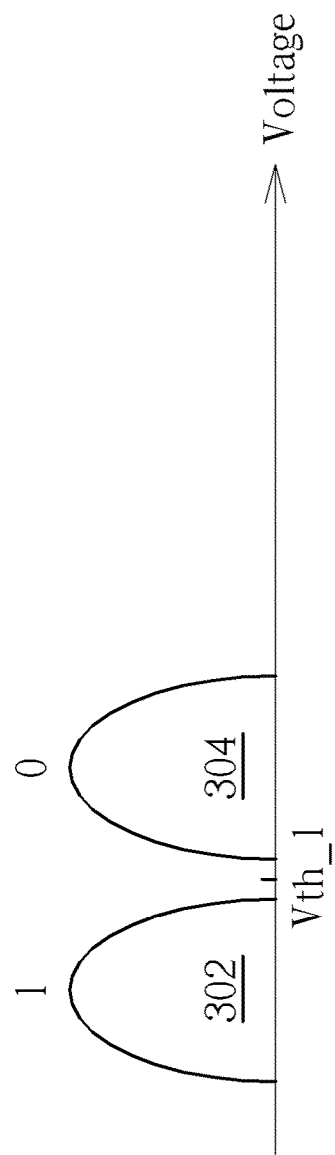
FIG. 3 is a diagram illustrating a floating gate of a flash memory unit after a first data bit is written to the flash memory unit according to an embodiment of the present invention.

FIG. 3 is a diagram illustrating the electrical charge amount in the floating gate 1024 of the flash memory unit 102 after being written with the first data bit according to an embodiment of the present invention. It can be seen from FIG. 3 that, if the data polarity is bit 1, the electrical charge amount in the floating gate 1024 of the flash memory unit 102 may be represented with the tag 302. If the data polarity is bit 0, the electrical charge amount in the floating gate 1024 of the flash memory unit 102 may be represented with the tag 304. Note that the tag 302 shown in FIG. 3 is used to facilitate the illustrations of the technical features of the flash memory unit 102 of the present invention. In practice, the floating gate 1024 has no electrical charge on the location indicated by the tag 302. If, however, the data polarity is bit 1, the floating gate 1024 (the tag 302 of floating gate 1024) of the flash memory unit 102 is injected with a small electrical charge amount. This also belongs to the scope of the present invention.

Next, after the flash memory unit 102 is written with the first data bit, the setting circuit 108 will determine a first threshold voltage Vth_1 (Step 210) located between the electrical charge amount indicated by the tag 302 and the electrical charge amount indicated by the tag 304, as shown in FIG. 3. In other words, when the first threshold voltage Vth_1 is coupled to the control gate 1022 (i.e. the gate) of the flash memory unit 102, the first threshold voltage Vth_1 may turn on the flash memory unit 102 with no electrical charge amount (i.e. the flash memory unit 102 indicated by the tag 302), and the first threshold voltage Vth_1 may turn off the flash memory unit 102 with an electrical charge amount (i.e. the flash memory unit 102 indicated by the tag 304). When the flash memory unit 102 is written with the first data bit, if a reading circuit (not shown) reads the first data bit, the reading circuit will generate the first threshold voltage Vth_1 in order to couple to the control gate 1022 of the flash memory unit 102. If the first threshold voltage Vth_1 turns on the flash memory unit 102, it means the data polarity of the first data bit stored in the flash memory unit 102 is bit 1; if the first threshold voltage Vth_1 does not turn on the flash memory unit 102, it means the data polarity of the first data bit stored in the flash memory unit 102 is bit 0.

If the writing circuit 106 further performs a data writing operation upon the flash memory unit 102 for the second time, then n=n+1 (i.e. n=2) and whether the condition n≤$n_{max}$ will be determined, wherein $n_{max}$ denotes the writing times upper limit of the flash memory unit 102. When the number of times of writing data into the flash memory unit 102 reaches $n_{max}$, the electrical charges inside the floating gate 1024 have to be erased before continuing to write data into the flash memory unit 102 (Step 202). Note that the present invention is not limited to merely using a specific circuit to execute Step 212 (i.e. the operations of setting n=n+1 and determining whether $n \leq n_{max}$). In this embodiment, the operations of Step 212 can be executed by any of the determining circuit 104, the writing circuit 106 and setting circuit 108.

Figure 4:
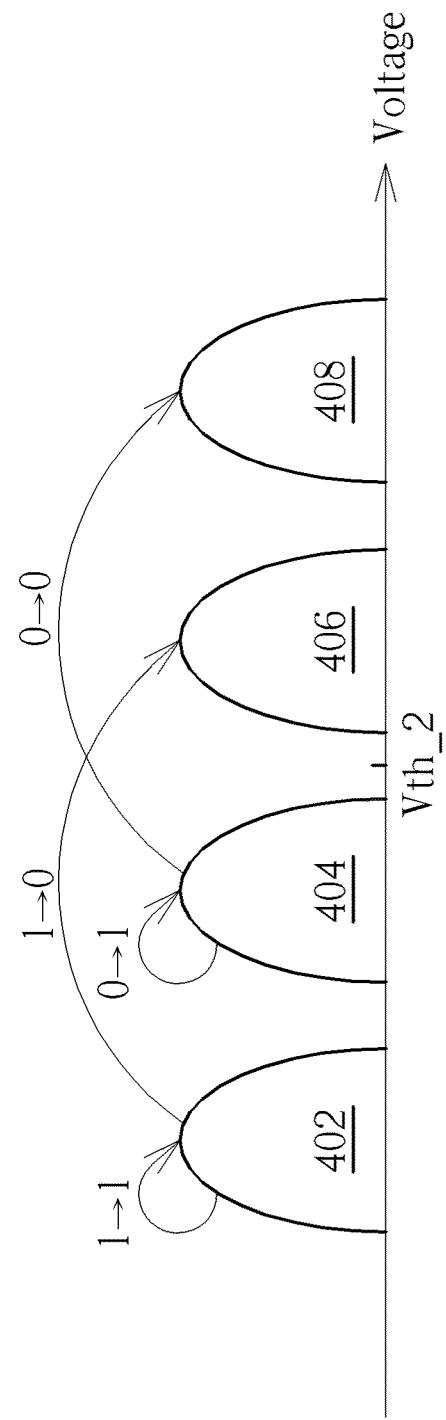
FIG. 4 is a diagram illustrating the electrical charge amount in a floating gate of a flash memory unit after a second data bit is written to the flash memory unit according to an embodiment of the present invention.

FIG. 4 is a diagram illustrating the electrical charge amount in the floating gate 1024 of the flash memory unit 102 after being written with a second data bit according to an embodiment of the present invention. In Step 206, when writing data into the flash memory unit 102 for the second time (i.e. n=2), the determining circuit 104 determines the data polarity of the second data bit to be written into the flash memory unit 102. If the data polarity is determined as a first polarity (i.e. bit 1), the writing circuit 106 will not inject a second electrical charge amount into the floating gate 1024 of the flash memory unit 102 (Step 208); if the data polarity is determined as a second polarity (i.e. bit 0), the writing circuit 106 will inject the second electrical charge amount into the floating gate 1024 of the flash memory unit 102 (Step 214). Specifically, if the data polarity of the first data bit stored in the flash memory unit 102 is bit 1, and the data polarity of the second data bit of the flash memory unit 102 is also bit 1, the writing circuit 106 will not inject the second electrical charge amount into the floating gate 1024 of the flash memory unit 102, thus reserving the electrical charge amount inside the floating gate 1024 of the flash memory unit 102, as indicated by the tag 402 in FIG. 4. If the data polarity of the first data bit of the flash memory unit 102 is bit 0, and the data polarity of the second data bit to be written into the flash memory unit 102 is bit 1, the writing circuit 106 will not inject the second electrical charge amount into the floating gate 1024 of the flash memory unit 102, thus reserving the electrical charge amount inside the floating gate 1024 of the flash memory unit 102 as indicated by the tag 404 shown in FIG. 4. If the data polarity of the first data bit stored in the flash memory unit 102 is bit 1, and the data polarity of the second data bit to be written into the flash memory unit 102 is bit 0, the writing circuit 106 injects the second electrical charge amount into the floating gate 1024 of the flash memory unit 102, making the electrical charge amount inside the floating gate 1024 of the flash memory unit 102 increase to the electrical charge amount as indicated by the tag 406. If the data polarity of the first data bit stored in the flash memory unit 102 is bit 0, and the data polarity of the second data bit to be written into the flash memory unit 102 is bit 0, the writing circuit 106 injects the second electrical charge amount into the floating gate 1024 of the flash memory unit 102, making the electrical charge amount inside the floating gate 1024 of the flash memory unit 102 increase to the electrical charge amount indicated by the tag 408. Note that the second electrical charge amount is at least larger than twice the first electrical charge amount. Hence, when the floating gate 1024 of the flash memory unit 102 is injected with the second electrical charge amount, the electrical charge amount indicated by the tag 406 will not overlap with the electrical charge amount indicated by the tag 404, and the electrical charge amount indicated by the tag 408 will not overlap with the electrical charge amount indicated by the tag 406.

After the flash memory unit 102 is written with a second data bit, the setting circuit 108 will determine a second threshold voltage Vth_2 (Step 210), which is located between the electrical charge amount indicated by the tag 404 and the electrical charge amount indicated by the tag 406, as shown in FIG. 4. When the second threshold voltage Vth_2 is coupled to the control gate 1022 of the flash memory unit 102, the second threshold voltage Vth_2 turns on the flash memory unit 102 which has the electrical charge amount indicated by the tag 402 or 404, and the second threshold voltage Vth_2 does not turn on the flash memory unit 102 which has the electrical charge amount indicated by the tag 406 or 408. After the flash memory unit 102 is written with the second data bit, when the reading circuit (not shown) reads the second data bit, the reading circuit will generate the second threshold voltage Vth_2 in order to couple to the control gate 1022 of the flash memory unit 102. If the second threshold voltage Vth_2 turns on the flash memory unit 102, this means the data polarity of the second data bit stored in the flash memory unit 102 is bit 1; if the second threshold voltage Vth_2 does not turn on the flash memory unit 102, it means the data polarity of the second data bit stored in the flash memory unit 102 is bit 0.

Figure 5:
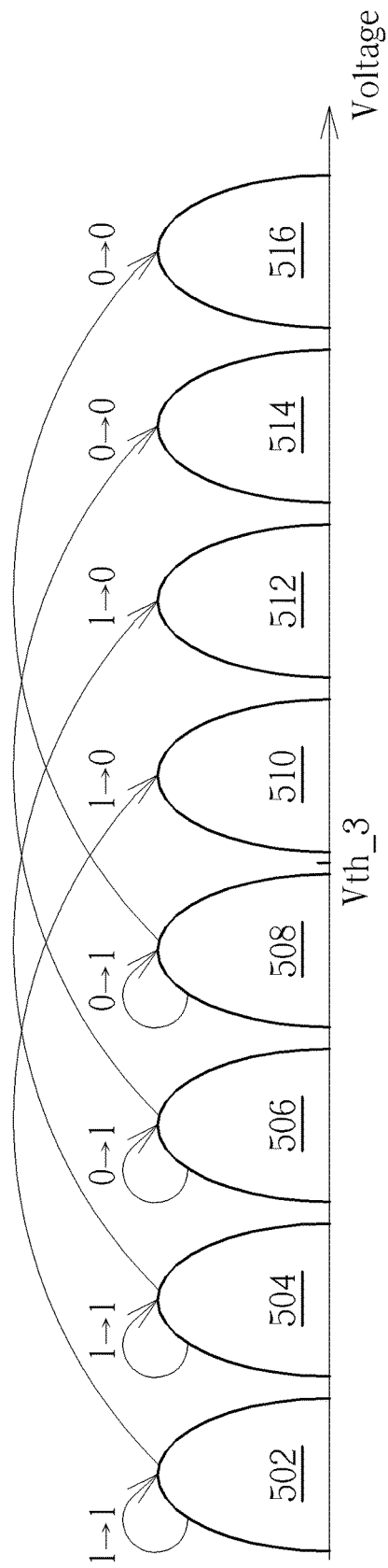
FIG. 5 is a diagram illustrating the electrical charge amount in a floating gate of a flash memory unit after a third data bit is written to the flash memory unit according to an embodiment of the present invention.

Similarly, if the writing circuit 106 performs the data writing operation upon the flash memory unit 102 for the third time, then n=n+1 (i.e. n=3), and whether $n \leq n_{max}$ will be determined. If $n \leq n_{max}$, the method 200 will repeatedly execute steps 206, 208 (or 214) and 210 in order to selectively inject a third electrical charge amount to the floating gate 1024 of the flash memory unit 102 and set corresponding third threshold voltage Vth_3, as shown in FIG. 5. FIG. 5 is a diagram illustrating the electrical charge amount in a floating gate 1024 of a flash memory unit 102 after being written with a third data bit according to an embodiment of the present invention. As can be seen from FIG. 5, no matter whether the data polarity of the second data bit stored in the flash memory unit 102 is bit 1 or 0, as long as the data polarity of the third data bit written into the flash memory unit 102 is bit 0, the writing circuit 106 will inject the third electrical charge amount into the floating gate 1024 of the flash memory unit 102, thus forming the electrical charge amounts indicated by the tag 510, 512, 514 or 516. No matter whether the data polarity of the second data bit stored in the flash memory unit 102 is bit 1 or 0, as long as the data polarity of the third data bit written into the flash memory unit 102 is bit 1, the writing circuit 106 will not inject the third electrical charge amount into the floating gate 1024 of the flash memory unit 102, thus resulting in the electrical charge amounts indicated by the tag 502, 504, 506 or 508.

Similarly, after the flash memory unit 102 is written with the third data bit, the setting circuit 108 will determine the third threshold voltage Vth_3 (Step 210), which is located between the electrical charge amount indicated by the tag 508 and the electrical charge amount indicated by the tag 510. When the third threshold voltage Vth_3 is coupled to the control gate 1022 of the flash memory unit 102, the third threshold voltage Vth_3 turns on the flash memory unit 102 which has the electrical charge amount indicated by the tag 502, 504, 506 or 508, and the third threshold voltage Vth_3 does not turn on the flash memory unit 102 which has the electrical charge amount indicated by the tag 510, 512, 514 or 516. After the flash memory unit 102 is written with the third data bit, when the reading circuit (not shown) reads the third data bit, the reading circuit will generate the third threshold voltage Vth_3 in order to couple to the control gate 1022 of the flash memory unit 102. If the third threshold voltage Vth_3 turns on the flash memory unit 102, it means the data polarity of the third data bit stored in the flash memory unit 102 is bit 1; if the second threshold voltage Vth_3 does not turn on the flash memory unit 102, it means the data polarity of the third data bit stored in the flash memory unit 102 is bit 0.

In this embodiment, the (n+1)-th threshold voltage Vth_n+1 is at least double the n-th threshold voltage Vth_n. For example, if the first threshold voltage Vth_1 is 0.3V, the second threshold voltage Vth_2 may be 0.6V, the third threshold voltage Vth_3 may be 1.2V, and so on. Further, the control device 100 of the present invention may be configured to include a look-up table (LUT), wherein the look-up table is arranged to record the count n of the writing times of the flash memory unit 102 and the n-th threshold voltage Vth_n corresponding to the count n. When the reading circuit (not shown) needs to read the n-th data bit currently stored in the flash memory unit 102, the reading circuit may directly utilize the look-up table to find the corresponding n-th threshold voltage Vth_n, and generate the n-th threshold voltage Vth_n to couple to the control gate 1022 of the flash memory unit 102, in order to read the n-th data bit currently stored in the flash memory unit 102.

Hence, the flash memory unit 102 of the present invention can be continuously written to until reaching the writing times upper limit $n_{max}$. If, for example, the writing times upper limit $n_{max}$ of a flash memory unit may be 5, when the flash memory unit is written for the fifth times, the electrical charges inside the floating gate have to be erased before going back to step 202 in order to write data into the flash memory unit again.

According to the above operating flow, before the number of writing times of the flash memory unit 102 of the present invention reaches the writing times upper limit $n_{max}$, the control device 100 of the present invention does not perform erasing operations upon the floating gate 1024 of the flash memory unit 102. In other words, before the writing times reach the writing times upper limit $n_{max}$, the control device 100 of the present invention either retains the electrical charge amount inside the floating gate 1024, or injects electrical charges into the floating gate 1024, and will erase electrical charges only when the number of writing times exceeds the writing times upper limit $n_{max}$.

Figure 6:
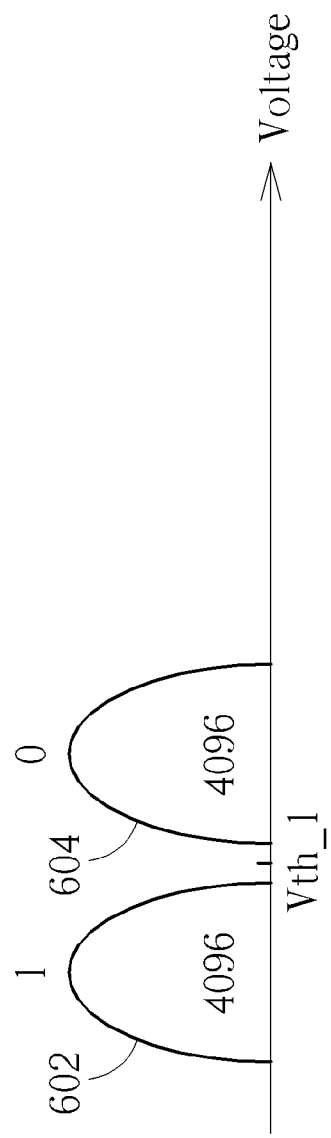
FIG. 6 is a diagram illustrating an electrical charge amount distribution after 8192 bits are written to a physical memory page for the first time according to an embodiment of the present invention.

In this way, the number of erasing times of the electrical charges of the flash memory unit 102 of the present invention can be greatly decreased during the data writing procedure, thus increasing the data writing speed and the service life of the flash memory unit 102. For better understanding of the main technical features of the control device 100, the present invention merely utilizes one single flash memory unit 102 to describe the operations of the control device; however, one skilled in the art will readily understand that the control device 100 of the present invention is applicable to a physical memory page which includes a plurality of logical pages, and each logical page includes a plurality of flash memory units. For example, if one physical memory page includes a total of 8192 flash memory units, when the control device 100 writes 8192 data bits into the 8192 flash memory units, respectively, for the first time, half the flash memory units (i.e. 4096 flash memory units) are written with bit 1 (the floating gates thereof will not be injected with the first electrical charge amount in this situation), and the other half of the flash memory units will be written with bit 0 (the floating gates thereof will be injected with the first electrical charge amount in this situation), as shown in FIG. 6. FIG. 6 is a diagram illustrating an electrical charge amount distribution after 8192 data bits are written to a physical memory page for the first time according to an embodiment of the present invention, wherein the floating gates of 4096 flash memory units indicated by the tag 602 are not injected with the first electrical charge amount, and the floating gates of the other 4096 flash memory units indicated by the tag 604 will be injected with the first electrical charge amount. Then, the setting circuit 108 will determine the first threshold voltage Vth_1 for reading the data bits in the 8192 flash memory units. The detailed operations related to reading data bits from a flash memory unit have been described in previous paragraphs, and are omitted here for brevity.

Figure 7:
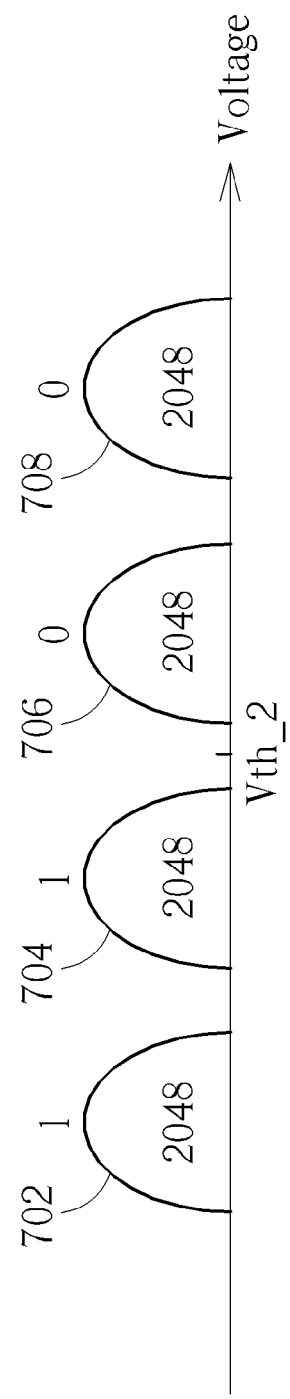
FIG. 7 is a diagram illustrating the electrical charge amount distribution after 8192 data bits are written to a physical memory page for the second time according to an embodiment of the present invention.

Similarly, when the control device 100 writes 8192 data bits into the 8192 flash memory units respectively for the second time, half the flash memory units (i.e. 4096 flash memory units) will be written with bit 1, and the other half of the flash memory units will be written with bit 0, wherein half of the 4096 flash memory units previously written with bit 1 (i.e. 2048 flash memory units) are now written with bit 0, and the other half of the 4096 flash memory units previously written with bit 1 (i.e. the other 2048 flash memory units) are now written with bit 1; and half of the 4096 flash memory units previously written with bit 0 (i.e. 2048 flash memory units) are now written with bit 0, and the other half of the 4096 flash memory units previously written with bit 0 (i.e. the other 2048 flash memory units) are now written with bit 1, as shown in FIG. 7.

FIG. 7 is a diagram illustrating the electrical charge amount distribution after 8192 data bits are written to a physical memory page for the second time according to an embodiment of the present invention. When the 2048 flash memory units previously injected with bit 1 are written with bit 0 in the second time writing operation, the 2048 flash memory units will be injected with the second electrical charge amount, thus forming the electrical charge distribution indicated by the tag 706; and when the 2048 flash memory units previously injected with bit 1 are written with bit 1 in the second time writing operation, the 2048 flash memory units will not be injected with the second electrical charge amount, thus retaining the electrical charge distribution indicated by the tag 702.

Similarly, when the 2048 flash memory units previously injected with bit 0 are written with bit 0 in the second time writing operation, the 2048 flash memory units will be injected with the second electrical charge amount, thus forming the electrical charge distribution indicated by the tag 708; and when the 2048 flash memory units previously injected with bit 0 are written with bit 1 in the second time writing operation, the 2048 flash memory units will not be injected with the second electrical charge amount, thus retaining the electrical charge distribution indicated by the tag 704. Then, the setting circuit 108 may determine the second threshold voltage Vth_2 for reading data bits in the 8192 flash memory units. After the control device 100 writes 8192 data bits into the 8192 flash memory units respectively for the second time, the data bits stored in half the flash memory units (i.e. 4096 flash memory units) are bit 1, and data bits stored in the other half (i.e. the other 4096 flash memory units) are bit 0.

Likewise, when the control device 100 writes 8192 data bits into the flash memory units respectively for the third time, half the flash memory units (i.e. 4096 flash memory units) will be written with bit 1, and the other half flash memory units will be written with bit 0. Specifically, half the 2048 flash memory units previously written with bit 1 (as indicated by the tag 702) in the second time writing will be written with bit 0 in the third time writing, and the other half will be written with bit 1 in the third time writing; half the 2048 flash memory units previously written with bit 1 (as indicated by the tag 704) in the second time writing will be written with bit 0 in the third time writing, and the other half will be written with bit 1 in the third time writing; half the 2048 flash memory units previously written with bit 0 (as indicated by the tag 706) in the second time writing will be written with bit 0 in the third time writing, and the other half will be written with bit 1 in the third time writing; and half the 2048 flash memory units previously written with bit 0 (as indicated by the tag 708) in the second time writing will be written with bit 0 in the third time writing, and the other half will be written with bit 1 in the third time writing.

Figure 8:
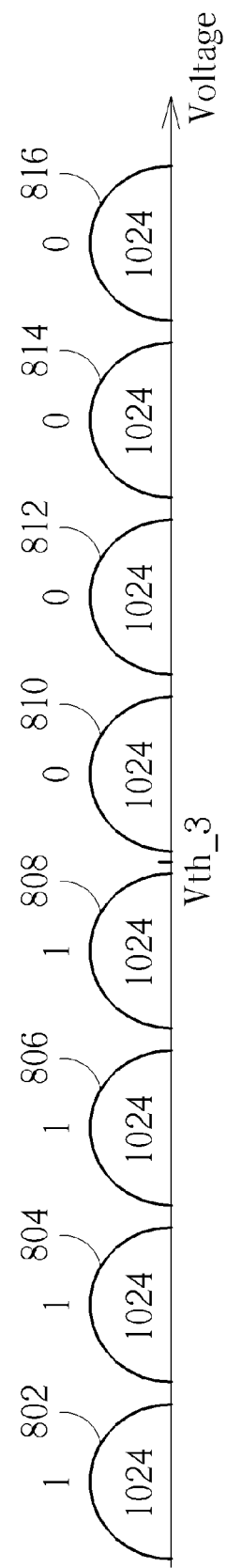
FIG. 8 is a diagram illustrating the electrical charge amount distribution after 8192 bits are written to a physical memory page for the third time according to an embodiment of the present invention.

FIG. 8 is a diagram illustrating the electrical charge amount distribution after 8192 data bits are written to a physical memory page for the third time according to an embodiment of the present invention. Accordingly, when the 1024 flash memory units previously storing bit 1 (i.e. the flash memory units having the electrical charge distribution indicated by the tag 702) are further written with bit 0, the 1024 flash memory units will be injected with the third electrical charge amount, thus forming the electrical charge distribution indicated by the tag 810; and when the 1024 flash memory units previously storing bit 1 (i.e. the flash memory units having the electrical charge distribution indicated by the tag 702) are further written with bit 1, the 1024 flash memory units will not be injected with the third electrical charge amount. For example, the electrical charge distribution is reserved as indicated by the tag 802.

When the 1024 flash memory units previously storing bit 1 (i.e. the flash memory units having the electrical charge distribution indicated by the tag 704) are further written with bit 0, the 1024 flash memory units will be injected with the third electrical charge amount, thus forming the electrical charge distribution indicated by the tag 812; and when the 1024 flash memory units previously storing bit 1 (i.e. the flash memory units having the electrical charge distribution indicated by the tag 704) are further written with bit 1, the 1024 flash memory units will not be injected with the third electrical charge amount, i.e. the electrical charge distribution is reserved as indicated by the 804. Similarly, when the 1024 flash memory units previously storing bit 0 (i.e. the flash memory units having the electrical charge distribution indicated by the tag 706) are further written with bit 0, the 1024 flash memory units will be injected with the third electrical charge amount, thus forming the electrical charge distribution indicated by the tag 814; and when the 1024 flash memory units previously storing bit 0 (i.e. the flash memory units having the electrical charge distribution indicated by the tag 706) are further written with bit 1, the 1024 flash memory unit will not be injected with the third electrical charge amount, i.e. the electrical charge distribution is reserved as indicated by the tag 806.

When the 1024 flash memory units previously storing bit 0 (i.e. the flash memory units having the electrical charge distribution as indicated by the tag 708) are further written with bit 0, the 1024 flash memory units will be injected with the third electrical charge amount, thus forming the electrical charge distribution as indicated by the tag 816; and when the 1024 flash memory units previously storing bit 0 (i.e. the flash memory units having the electrical charge distribution indicated by the tag 708) are further written with bit 1, these 1024 flash memory units will not be injected with the third electrical charge amount, i.e. the electrical charge distribution is reserved as indicated by the tag 808.

Next, the setting circuit 108 determines the third threshold voltage Vth_3 in order to read data bits inside the 8192 flash memory units. After the control device 100 writes 8192 data bits into the 8192 flash memory units, respectively, for the third time, data bits stored in half of the flash memory units (i.e. 4096 flash memory units) are bit 1, and data bits stored in the other half (i.e. the other 4096 flash memory units) are bit 0.

The physical memory page of the present invention can be repeatedly written to until the writing time upper limit $n_{max}$ is reached. Before the writing times reaches the writing time upper limit $n_{max}$, the control device 100 of the present invention may either reserve the electrical charges inside the flash memory unit, or inject electrical charges into the flash memory unit, and then erase electrical charges when the writing times exceeds the writing times upper limit $n_{max}$. In this way, the physical memory page of the present invention may greatly decrease the number of times of erasing electrical charges during the data writing procedure.

In view of the above, the method for controlling a flash memory control circuit proposed by the present invention continuously injects electrical charges into flash memory units of a physical memory page, and correspondingly updates a threshold voltage for reading the flash memory units. Further, the electrical charges will be erased when the writing times reaches a writing time upper limit. In this way, the present invention may greatly decrease the number of times of erasing electrical charges during a data writing procedure, thus increasing the data writing speed of the physical memory page and extending the service life of the physical memory page and the entire flash memory.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for writing data into a flash memory unit, the method comprising:
   when writing data into the flash memory unit for the n-th time, determining a data polarity of an n-th data bit to be written into the flash memory unit;
   selectively injecting an n-th electrical charge amount into a floating gate of the flash memory unit according to the data polarity of the n-th data bit only;
   when writing data into the flash memory unit for the (n+1)-th time, determining the data polarity of an (n+1)-th data bit to be written into the flash memory unit; and
   selectively injecting an (n+1)-th electrical charge amount into the floating gate of the flash memory unit according to the data polarity of the (n+1)-th data bit only;
   wherein the (n+1)-th electrical charge amount is not equal to the n-th electrical charge amount, and n is a positive integer not less than 1.

2. The method of claim 1, wherein the (n+1)-th electrical charge amount is at least double the n-th electrical charge amount.

3. The method of claim 1, wherein when writing data into flash memory unit for the n-th time, if the data polarity of the n-th data bit is a first polarity, not injecting the n-th electrical charge amount to the floating gate, and if the data polarity of the n-th data bit is a second polarity, injecting the n-th electrical charge amount to the floating gate; and when writing data into the flash memory unit for the (n+1)-th time, if the data polarity of the (n+1)-th data bit is the first polarity, not injecting the (n+1)-th electrical charge amount to the floating gate, and if the data polarity of the (n+1)-th data bit is the second polarity, injecting the (n+1)-th electrical charge amount to the floating gate, wherein the first polarity is different from the second polarity.

4. The method of claim 3, wherein the first polarity is bit 1, and the second polarity is bit 0; or the first polarity is bit 0, and the second polarity is bit 1.

5. The method of claim 3, wherein if the data polarity of the n-th data bit is the first polarity, the method further comprises:
   determining an n-th threshold voltage;
   wherein when the n-th threshold voltage is coupled to a control gate of the flash memory unit, the n-th threshold voltage turns on the flash memory unit which is not injected with the n-th electrical charge amount.

6. The method of claim 5, wherein if the data polarity of the (n+1)-th data bit is the first polarity, the method further comprises:
   determining an (n+1)-th threshold voltage;
   wherein when the (n+1)-th threshold voltage is coupled to the control gate of the flash memory unit, the (n+1)-th threshold voltage turns on the flash memory unit which is not injected with the (n+1)-th electrical charge amount, and the (n+1)-th threshold voltage is at least double the n-th threshold voltage.

7. The method of claim 5, wherein if the data polarity of the (n+1)-th data bit is the second polarity, the method further comprises:
   determining an (n+1)-th threshold voltage;
   wherein when the (n+1)-th threshold voltage is coupled to the control gate of the flash memory unit, the (n+1)-th threshold voltage does not turn on the flash memory unit which is injected with the (n+1)-th electrical charge amount, and the (n+1)-th threshold voltage is at least double the n-th threshold voltage.

8. The method of claim 3, wherein if the data polarity of the n-th data bit is the second polarity, the method further comprises:
   determining an n-th threshold voltage;
   wherein when the n-th threshold voltage is coupled to a control gate of the flash memory unit, the n-th threshold voltage does not turn on the flash memory unit which is injected with the n-th electrical charge amount.

9. The method of claim 8, wherein if the data polarity of the (n+1)-th data bit is the first polarity, the method further comprises:
   determining an (n+1)-th threshold voltage;
   wherein the (n+1)-th threshold voltage is coupled to the control gate of the flash memory unit, the (n+1)-th threshold voltage turns on the flash memory unit which is not injected with the (n+1)-th electrical charge amount, and the (n+1)-th threshold voltage is at least double the n-th threshold voltage.

10. The method of claim 8, wherein if the data polarity of the (n+1)-th data bit is the second polarity, the method further comprises:
    determining an (n+1)-th threshold voltage;
    wherein the (n+1)-th threshold voltage is coupled to the control gate of the flash memory unit, the (n+1)-th threshold voltage does not turn on the flash memory unit which is injected with the (n+1)-th electrical charge amount, and the (n+1)-th threshold voltage is at least double the n-th threshold voltage.

11. A control device, arranged to write data into a flash memory unit, the control device comprising:
    a determining circuit, arranged to determine a data polarity of an n-th data bit of the flash memory unit when writing data into the flash memory unit for the n-th time; and
    a writing circuit, arranged to inject an n-th electrical charge amount to a floating gate of the flash memory unit according to the data polarity of the n-th data bit only;
    wherein the determining circuit is further arranged to determine the data polarity of an (n+1)-th data bit of the flash memory unit when writing data into the flash memory unit for the (n+1)-th time, the writing circuit is further arranged to selectively inject an (n+1)-th electrical charge amount to the floating gate of the flash memory unit according to the data polarity of the (n+1)-th data bit only, the (n+1)-th electrical charge amount is not equal to the n-th electrical charge amount, and n is a positive integer not smaller than 1.

12. The control device of claim 11, wherein the (n+1)-th electrical charge amount is at least double the n-th electrical charge amount.

13. The control device of claim 11, wherein when writing data into the flash memory unit for the n-th time, if the determining circuit determines that the data polarity of the n-th data bit is a first polarity, the writing circuit does not inject the n-th electrical charge amount into the floating gate, if the determining circuit determines that the data polarity of the n-th data bit is a second polarity, the writing circuit injects the n-th electrical charge amount into the floating gate; and when writing data into the flash memory unit for the (n+1)-th time, if the determining circuit determines that the flash memory unit of the (n+1)-th data bit is the first polarity, the writing circuit does not inject the (n+1)-th electrical charge amount into the floating gate, and if the determining circuit determines that the data polarity of the (n+1)-th data bit is the second polarity, the writing circuit injects the (n+1)-th electrical charge amount into the floating gate, wherein the first polarity is not equal to the second polarity.

14. The control device of claim 13, wherein the first polarity is bit 1, and the second polarity is bit 0; or the first polarity is bit 0, and the second polarity is bit 1.

15. The control device of claim 13, wherein if the data polarity of the n-th data bit is the first polarity, the control circuit further comprises:
    a setting circuit, arranged to determine an n-th threshold voltage;
    wherein when the n-th threshold voltage is coupled to a control gate of the flash memory unit, the n-th threshold voltage turns on the flash memory unit which is not injected with the n-th electrical charge amount.

16. The control device of claim 15, wherein if the data polarity of the (n+1)-th data bit is the first polarity, the control circuit further comprises:
    a setting circuit, arranged to determine an (n+1)-th threshold voltage;
    wherein when the (n+1)-th threshold voltage is coupled to the control gate of the flash memory unit, the (n+1)-th threshold voltage turns on the flash memory unit which is not injected with the (n+1)-th electrical charge amount, and the (n+1)-th threshold voltage is at least double the n-th threshold voltage.

17. The control device of claim 15, wherein if the data polarity of the (n+1)-th data bit is the second polarity, the control circuit further comprises:
    a setting circuit, arranged to determine an (n+1)-th threshold voltage;
    wherein when the (n+1)-th threshold voltage is coupled to the control gate of the flash memory unit, the (n+1)-th threshold voltage does not turn on the flash memory unit which is injected with the (n+1)-th electrical charge amount, and the (n+1)-th threshold voltage is at least double the n-th threshold voltage.

18. The control device of claim 13, wherein if the data polarity of the n-th data bit is the second polarity, the control circuit further comprises:
  a setting circuit, determining an n-th threshold voltage;
  wherein when the n-th threshold voltage is coupled to a control gate of the flash memory unit, the n-th threshold voltage does not turn on the flash memory unit which is injected with the n-th electrical charge amount.

19. The control device of claim 18, wherein if the data polarity of the (n+1)-th data bit is the first polarity, the control circuit further comprises:
  a setting circuit, determining an (n+1)-th threshold voltage;
  wherein when the (n+1)-th threshold voltage is coupled to the control gate of the flash memory unit, the (n+1)-th threshold voltage turns on the flash memory unit which is not injected with the (n+1)-th electrical charge amount, and the (n+1)-th threshold voltage is at least double the n-th threshold voltage.

20. The control device of claim 18, wherein if the data polarity of the (n+1)-th data bit is the second polarity, the control circuit further comprises:
  a setting circuit, determining an (n+1)-th threshold voltage;
  wherein when the (n+1)-th threshold voltage is coupled to the control gate of the flash memory unit, the (n+1)-th threshold voltage does not turn on the flash memory unit which is injected with the (n+1)-th electrical charge amount, and the (n+1)-th threshold voltage is at least double the n-th threshold voltage.

* * * * *